United States Patent
Fukuoka

(10) Patent No.: US 11,173,631 B2
(45) Date of Patent: Nov. 16, 2021

(54) CUTTING APPARATUS

(71) Applicant: DISCO CORPORATION, Tokyo (JP)

(72) Inventor: Takeomi Fukuoka, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 60 days.

(21) Appl. No.: 16/442,824

(22) Filed: Jun. 17, 2019

(65) Prior Publication Data

US 2020/0391410 A1  Dec. 17, 2020

(51) Int. Cl.
*B28D 5/00* (2006.01)
*B28D 5/02* (2006.01)
*H01L 21/673* (2006.01)
*H01L 21/677* (2006.01)

(52) U.S. Cl.
CPC ......... *B28D 5/0094* (2013.01); *B28D 5/0064* (2013.01); *B28D 5/0076* (2013.01); *B28D 5/023* (2013.01); *H01L 21/673* (2013.01); *H01L 21/677* (2013.01)

(58) Field of Classification Search
CPC .. B28D 5/0094; B28D 5/0064; B28D 5/0076; B28D 5/0023; H01L 21/673; H01L 21/677

See application file for complete search history.

(56) References Cited

U.S. PATENT DOCUMENTS

| 7,329,079 B2 * | 2/2008 | Ohkawara | H01L 21/681 414/217 |
| 7,338,345 B2 * | 3/2008 | Fujinami | B28D 5/024 451/5 |
| 7,727,810 B2 * | 6/2010 | Arai | H01L 21/67092 438/113 |
| 2001/0040197 A1 * | 11/2001 | Sekiya | H01L 21/67092 241/101.4 |
| 2005/0118938 A1 * | 6/2005 | Mizomoto | B24B 37/345 451/65 |
| 2006/0112802 A1 * | 6/2006 | Fujinami | B28D 5/024 83/310 |
| 2007/0238264 A1 * | 10/2007 | Sekiya | H01L 21/67132 438/460 |
| 2008/0102542 A1 * | 5/2008 | Negishi | H01L 21/67092 438/16 |
| 2008/0285021 A1 * | 11/2008 | Sekiya | G01N 21/94 356/237.4 |
| 2012/0088354 A1 * | 4/2012 | Furuta | B23K 26/40 438/463 |
| 2019/0378732 A1 * | 12/2019 | Hanajima | B28D 5/0094 |
| 2020/0391410 A1 * | 12/2020 | Fukuoka | B28D 5/0094 |

FOREIGN PATENT DOCUMENTS

JP       2017084950 A    5/2017

* cited by examiner

*Primary Examiner* — Laura M Lee

(74) *Attorney, Agent, or Firm* — Greer, Burns & Crain, Ltd.

(57) ABSTRACT

A cutting apparatus includes a cutting unit cutting a workpiece held on a chuck table, a processing-feed unit moving the chuck table, a moving unit moving the cutting unit, and a delivery pad delivering the workpiece to be cut to the chuck table and delivering the workpiece that has been cut on the chuck table. The delivery pad is mountable on and detachable from the moving unit, holds the workpiece under suction while being mounted on the moving unit, and delivers the workpiece by being moved by the moving unit while holding the workpiece under suction.

8 Claims, 7 Drawing Sheets

CUTTING APPARATUS

BACKGROUND OF THE INVENTION

Field of the Invention

The present invention relates to a cutting apparatus for cutting a workpiece with a cutting blade.

Description of the Related Art

There are known in the art a cutting apparatus for cutting substrates such as semiconductor wafers, packaged substrates, ceramics substrates, glass substrates, etc. with a cutting blade mounted on a spindle in processes of manufacturing device chips. The cutting apparatus includes a cutting unit having a cutting blade and a chuck table for holding a workpiece.

The operator of the cutting apparatus loads a workpiece into the cutting apparatus and places the workpiece on a holding surface provided by the upper surface of the chuck table. The operator then causes the chuck table to hold the workpiece under suction on the holding surface, and rotates the cutting blade and brings the cutting blade into contact with the workpiece, thereby cutting the workpiece. After completing the cutting of the workpiece, the operator removes the workpiece from the chuck table. The cutting apparatus in which the operator manually takes the workpiece onto and from the chuck table is known as a manually operable cutting apparatus.

There is also known in the art a fully automatic cutting apparatus that automatically takes a workpiece onto and from a chuck table. The fully automatic cutting apparatus includes a placing area where a workpiece to be processed can be placed, an unloading area where a processed workpiece can be placed, and a delivery mechanism for delivering a workpiece to and from the chuck table. The delivery mechanism loads a workpiece to be processed that is placed in the placing area onto the chuck table and unloads a processed workpiece from the chuck table into the unloading area. The fully automatic cutting apparatus may also include a cleaning unit for cleaning a processed workpiece.

The manually operable cutting apparatus that includes no delivery mechanism is relatively simple in structure and has a small footprint when installed in place. However, the operator is required to work periodically on the cutting apparatus because the operator has to manually load and unload a workpiece at certain timings before and after a cutting process. On the other hand, the fully automatic cutting apparatus with the delivery mechanism allows the operator to take a workpiece into and out of the cutting apparatus at desired timings during a cutting process. However, the delivery mechanism makes the cutting apparatus complex in structure, costly to manufacture, and large in size, requiring a relatively large installation space. There has been proposed a fully automatic cutting apparatus including a delivery mechanism that has a relatively simple structure for delivering workpieces (see Japanese Patent Laid-Open No. 2017-84950).

SUMMARY OF THE INVENTION

The delivery mechanism of the fully automatic cutting apparatus disclosed in Japanese Patent Laid-Open No. 2017-84950 requires independent drive systems for respectively loading and unloading a workpiece. Therefore, the disclosed fully automatic cutting apparatus is still complex in structure and relatively highly costly to manufacture compared with the manually operable cutting apparatus.

It is therefore an object of the present invention to provide a cutting apparatus capable of loading and unloading a workpiece without using an independent delivery mechanism.

In accordance with an aspect of the present invention, there is provided a cutting apparatus including: a cutting unit cutting a workpiece held on a holding surface of a chuck table with a cutting blade mounted on a spindle; a processing-feed unit moving the chuck table in a processing-feed direction parallel to the holding surface, between a processing area for cutting the workpiece and a loading/unloading area for loading and unloading the workpiece; a moving unit moving the cutting unit in an indexing-feed direction parallel to the holding surface and perpendicular to the processing-feed direction and in a direction perpendicular to the holding surface; a placing area disposed adjacent to the loading/unloading area, and placing the workpiece to be cut therein; an unloading unit unloading the workpiece that has been cut; and a delivery pad delivering the workpiece to be cut placed in the placing area to the chuck table positioned in the loading/unloading area and delivering the workpiece that has been cut on the chuck table to the unloading unit, in which the delivery pad is mountable on and detachable from the moving unit in a standby area disposed adjacent to the loading/unloading area, holds the workpiece under suction while being mounted on the moving unit, and delivers the workpiece by being moved by the moving unit while holding the workpiece under suction.

Preferably, the delivery pad includes an engageable portion as an upper portion thereof, the moving unit has a movable plate to which the cutting unit is fixed and an arm extending from the movable plate in the processing-feed direction and having an engaging portion for engaging the engageable portion, and the movable plate is moved in a direction perpendicular to the holding surface to cause the engaging portion of the arm to engage the engageable portion of the delivery pad placed in the standby area, thereby coupling the delivery pad to the movable plate.

Preferably, the unloading unit includes an unloading table for placing the workpiece thereon, the unloading table being movable between an area immediately above the loading/unloading area and an unloading area disposed laterally of the processing-feed unit, and the unloading unit moves the unloading table with the workpiece placed thereon by the delivery pad when positioned in the area immediately above the loading/unloading area, to the unloading area, thereby unloading the workpiece.

Preferably, the cutting apparatus may further include a drying nozzle disposed over a path along which the unloading table is movable, and ejecting a gas to the workpiece placed on the unloading table to remove a liquid deposited on the workpiece while the workpiece is cut by the cutting blade, from the workpiece. The cutting apparatus may further include a cleaning nozzle disposed over a path along which the chuck table is movable by the processing-feed unit, and ejecting a liquid to the holding surface of the chuck table or the workpiece held on the chuck table to clean the holding surface of the workpiece.

The cutting apparatus according to the aspect of the present invention includes the delivery pad for delivering the workpiece from the placing area to the chuck table and delivering the workpiece from the chuck table to the unloading unit. The delivery pad is mountable on and detachable from the moving unit that moves the cutting unit, and is moved by the moving unit. Therefore, the cutting apparatus does not require a moving mechanism having an independent drive system only for moving the delivery pad. When the delivery pad does not delivery the workpiece, such as when the workpiece is cut by the cutting blade, the delivery pad is separated from the moving unit. Consequently, the moving unit that moves the cutting unit is free from an increased load.

Accordingly, the present invention provides a cutting apparatus capable of loading and unloading a workpiece without using an independent delivery mechanism.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
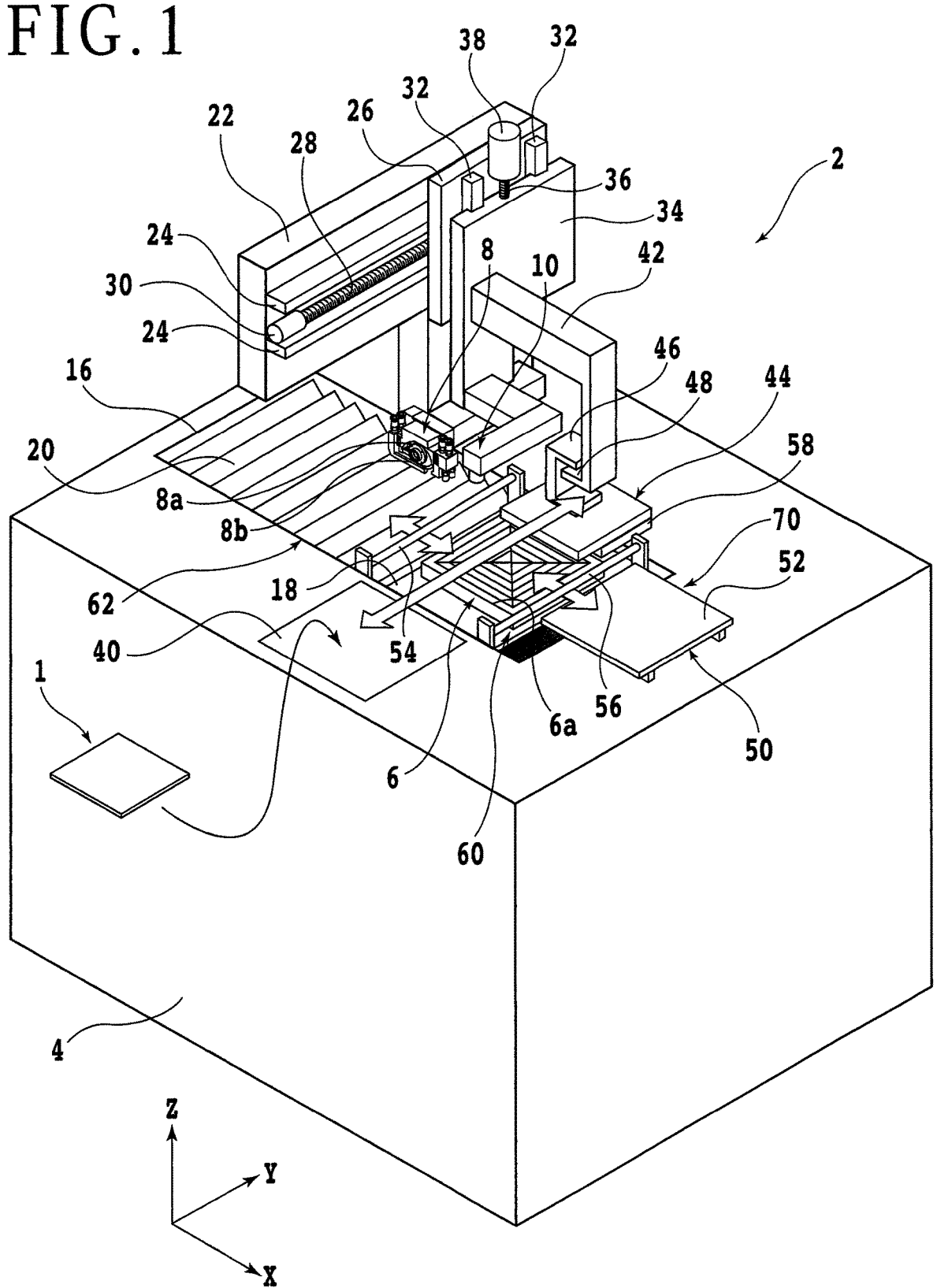
FIG. 1 is a perspective view schematically illustrating a workpiece and a cutting apparatus.

A cutting apparatus according to an embodiment of the present invention will hereinafter be described below with reference to the drawings. First, a workpiece to be cut by the cutting apparatus will be described below with reference to FIG. 1. FIG. 1 schematically illustrates in perspective the workpiece and the cutting apparatus. The workpiece, denoted by 1, is a substrate made of silicon, silicon carbide (SiC), any of other materials such as a semiconductor, or a material such as sapphire, glass, quartz, ceramics, or the like. The workpiece 1 is also a packaged substrate with devices formed thereon that are encapsulated by resin. The workpiece 1 has a grid of projected dicing lines by which the surface thereof is demarcated into a plurality of areas where the devices are present. When the workpiece 1 is cut along the projected dicing lines, it is divided into individual device chips carrying the respective devices.

Next, the cutting apparatus, denoted by 2, according to the present embodiment will be described below. As illustrated in FIG. 1, X-, Y-, and Z-axes are established with respect to the cutting apparatus 2. The X-axis extends horizontally and the Y-axis extends horizontally perpendicularly to the X-axis. The Z-axis extends vertically perpendicularly to both the X-axis and the Y-axis. Directions along the X-, Y-, and Z-axes will be referred to as X-axis, Y-axis, and Z-axis directions.

The cutting apparatus 2 includes an apparatus base 4 supporting various apparatus components thereon. The cutting apparatus 2 includes a chuck table 6 mounted on an upper surface of the apparatus base 4, for holding the workpiece 1 under suction thereon, and a cutting unit 8 for cutting the workpiece 1. When the cutting apparatus 2 is in operation, the chuck table 6 holds the workpiece 1 under suction thereon, and the cutting unit 8 cuts the workpiece 1. The cutting apparatus 2 also includes a camera unit 10 positioned adjacent to the cutting unit 8, for capturing an image of the workpiece 1 for aligning the cutting unit 8 with the workpiece 1.

The chuck table 6 has a suction channel, not depicted, defined therein that has an end connected to a suction source, not depicted, and another end connected to a porous member disposed on an upper surface of the chuck table 6. The porous member is exposed upwardly and has an upper surface serving as a holding surface 6a of the chuck table 6. When the workpiece 1 is placed on the holding surface 6a and the suction source is actuated to apply a negative pressure through the suction channel and the porous member to the workpiece 1, the workpiece 1 is held under suction on the chuck table 6. The chuck table 6 is rotatable about an axis perpendicular to the holding surface 6a.

The apparatus base 4 has a rectangular opening 16 defined centrally in an upper surface thereof and having longer sides extending along the X-axis directions. The opening 16 houses therein an X-axis movable table 18 supporting the chuck table 6 thereon and a dust-proof, drip-proof cover 20 having an end attached to the X-axis movable table 18. A processing-feed unit, not depicted, for moving the X-axis movable table 18 along the X-axis directions parallel to the holding surface 6a is disposed in a region defined in the apparatus base 4 below the X-axis movable table 18 and protected by the dust-proof, drip-proof cover 20. The processing-feed unit processing-feeds the chuck table 6 in the X-axis directions when the workpiece 1 is cut by the cutting unit 8. The X-axis directions represent processing-feed directions. The processing-feed unit moves the chuck table 6 in the processing-feed directions between a processing area 62 where the workpiece 1 is cut by the cutting unit 8 and a loading/unloading area 60 where the workpiece 1 is loaded onto and unloaded from the chuck table 6.

A support structure 22 having an arm extending over the opening 16 is vertically mounted on a rear portion of the upper surface of the apparatus base 4. The support structure 22 supports on its front surface a pair of Y-axis guide rails 24 extending parallel to each other in the Y-axis directions. A Y-axis movable plate 26 is slidably mounted on the Y-axis guide rails 24 for movement in the Y-axis directions. A nut, not depicted, is disposed on a rear surface of the Y-axis movable plate 26 and threaded over a Y-axis ball screw 28 extending parallel to the Y-axis guide rails 24. The Y-axis ball screw 28 has an end coupled to a Y-axis stepping motor 30 mounted on the support structure 22. When the Y-axis stepping motor 30 is energized to rotate the Y-axis ball screw 28 about its own axis, the Y-axis movable plate 26 is moved in one of the Y-axis directions along the Y-axis guide rails 24. The Y-axis guide rails 24, the Y-axis movable plate 26, the Y-axis ball screw 28, and the Y-axis stepping motor 30 jointly function as an indexing-feed unit for indexing-feeding the cutting unit 8 and the camera unit 10 in the Y-axis directions. The Y-axis directions represent indexing-feed directions.

The Y-axis movable plate 26 supports on its front surface a pair of Z-axis guide rails 32 extending parallel to each other in the Z-axis directions and a Z-axis movable plate 34 slidably mounted on the Z-axis guide rails 32 for movement in the Z-axis directions. nut, not depicted, is disposed on a rear surface of the Z-axis movable plate 34 and threaded over a Z-axis ball screw 36 extending parallel to the Z-axis guide rails 32. The Z-axis ball screw 36 has an end coupled to a Z-axis stepping motor 38 mounted on the Y-axis movable plate 26. When the Z-axis stepping motor 38 is energized to rotate the Z-axis ball screw 36 about its own axis, the Z-axis movable plate 34 is moved in one of the Z-axis directions along the Z-axis guide rails 32. The cutting unit 8 and the camera unit 10 are fixed to a lower portion of a front surface of the Z-axis movable plate 34. The Z-axis guide rails 32, the Z-axis movable plate 34, the Z-axis ball screw 36, and the Z-axis stepping motor 38 jointly function as a vertically moving unit for moving the cutting unit 8 and the camera unit 10 in the Z-axis directions that are perpendicular to the holding surface 6a of the chuck table 6. The indexing-feed unit and the vertically moving unit jointly function as a moving unit for moving the cutting unit 8 and the camera unit 10.

The cutting unit 8 includes a spindle, not depicted, extending in the Y-axis directions and an annular cutting blade 8a mounted on a distal end of the spindle. The spindle has an opposite distal end connected to a spindle motor, not depicted, for rotating the spindle about its own axis along the Y-axis directions. When the spindle motor is energized to rotate the spindle about its own axis, the cutting blade 8a is rotated about its own axis. The cutting blade 8a has a cutting edge on its outer circumferential portion. The cutting edge is made of abrasive grains and a binder in which the abrasive grains are dispersed. When the rotating cutting blade 8a is positioned at a predetermined height and the X-axis movable table 18 is moved in one of the processing-feed directions, the cutting blade 8a cuts the workpiece 1 on the holding surface 6a of the chuck table 6.

When the cutting blade 8a cuts the workpiece 1, the workpiece 1 produces chips that are scattered around. In addition, the cutting blade 8a and the workpiece 1 are heated to a high temperature due to frictional heat generated as the cutting blade 8a cuts the workpiece 1. While the workpiece 1 is being cut by the cutting blade 8a, the cutting blade 8a and the workpiece 1 are supplied with a cutting fluid. Specifically, the cutting unit 8 has a nozzle 8b disposed laterally of the cutting blade 8a for supplying the cutting fluid to the upper surface of the workpiece 1 and the cutting blade 8a. The cutting fluid supplied from the nozzle 8b is, for example, pure water. The cutting fluid has a function to cool the workpiece 1 and the cutting blade 8a. The chips produced from the workpiece 1 are caused to flow off the workpiece 1 by the cutting fluid, and hence are removed.

A placing area 40 where a workpiece 1 to be cut can be placed is disposed in a position adjacent to the loading/unloading area 60 on the upper surface of the apparatus base 4. The operator of the cutting apparatus 2 places a workpiece 1 to be cut on the placing area 40 at a desired timing. An unloading unit 50 for unloading a workpiece 1 that has been cut is disposed in another position adjacent to the loading/unloading area 60 on the upper surface of the apparatus base 4. The unloading unit 50 includes an unloading table 52 for placing a workpiece 1 thereon. The unloading table 52 is movable between an area immediately above the loading/unloading area 60 and an unloading area 70 disposed laterally of the processing-feed unit. A workpiece 1 that has been cut is placed on the unloading unit 50 positioned in the area above the loading/unloading area 60. The unloading unit 50 then unloads the workpiece 1 by moving to the unloading area 70.

The cutting apparatus 2 includes a delivery pad 44 for delivering a workpiece 1 placed in the placing area 40 to the chuck table 6 positioned in the loading/unloading area 60, and delivering the workpiece 1 on the chuck table 6 to the unloading table 52 of the unloading unit 50. The delivery pad 44 is detachably mounted on the Z-axis movable plate 34 of the moving unit. A standby area 58 where the delivery pad 44 can be placed is disposed in still another position adjacent to the loading/unloading area 60. The delivery pad 44 is placed in the standby area 58 when it is not mounted on the Z-axis movable plate 34. The delivery pad 44 has a lower surface serving as a suction surface for holding the workpiece 1 under suction. The delivery pad 44 includes a suction channel 68 (see FIGS. 2A through 3B) defined therein which has an end joined to the suction surface and another end joined to a bracket-shaped engageable portion 46 as an upper portion of the delivery pad 44.

An arm 42 extending in the processing-feed directions, i.e., the X-axis directions, is fixed to the front surface of the Z-axis movable plate 34. The arm 42 includes an engaging portion 48 as a lower distal-end portion thereof for engaging the engageable portion 46 of the delivery pad 44. The arm 42 has two suction channels 64 and 66 (see FIGS. 2A through 3B) defined therein that have ends extending into the engaging portion 48. The suction channels 64 and 66 have other ends connected to respective independent suction sources, not depicted. When a negative pressure from the suction source connected to the suction channel 64 acts through the suction channel 64 and the engaging portion 48 on the engageable portion 46 of the delivery pad 44, the engageable portion 46 is kept in engagement with the engaging portion 48 under suction. When the delivery pad 44 is thus held in engagement with the arm 42, the suction channel 66 in the arm 42 is kept in fluid communication with the suction channel 68 in the delivery pad 44. A negative pressure from the suction source connected to the suction channel 66 acts through the suction channel 66 and the suction channel 68 on the lower suction surface of the delivery pad 44, enabling the delivery pad 44 to hold the workpiece 1 under suction.

The arm 42 and the engageable portion 46 are made of a metal material chiefly including aluminum, for example, for making themselves lightweight. However, for allowing the engageable portion 46 and the engaging portion 48 to be held in intimate contact with each other, their mutually contacting portions may be made of stainless steel and may be polished. In addition, the mutually contacting portions of the engageable portion 46 and the engaging portion 48 may have a seal member such as an O-ring or the like disposed in surrounding relation to respective joints of the suction channels 66 and 68 to hermetically seal the joints.

The cutting apparatus 2 includes a pipe-shaped cleaning nozzle 54 disposed above the path along which the chuck table 6 moves between the processing area 62 and the loading/unloading area 60 and extending over the opening 16 in the indexing-feed directions, i.e., the Y-axis directions. The cleaning nozzle 54 has a plurality of ejection ports, not depicted, directed downwardly for ejecting a cleaning liquid such as pure water or the like therethrough. When the chuck table 6 moves from the processing area 62 to the loading/unloading area 60, the cleaning nozzle 54 ejects the cleaning liquid to clean the workpiece 1 that has been cut by the cutting unit 8. For an increased cleaning effect, the cleaning nozzle 54 may eject the cleaning liquid under a high pressure toward the workpiece 1. The cleaning nozzle 54 may eject a mixture of two fluids such as air and water.

The cutting apparatus 2 also includes a pipe-shaped drying nozzle 56 disposed above the path along which the unloading table 52 moves between the area immediately above the loading/unloading area 60 and the unloading area 70 and extending over the path in the indexing-feed directions, i.e., the Y-axis directions. The drying nozzle 56 has a plurality of ejection ports, not depicted, directed downwardly for ejecting a gas such as dry air or the like therethrough. When the unloading table 52 moves from the area immediately above the loading/unloading area 60 to the unloading area 70, the drying nozzle 56 ejects the gas to dry the workpiece 1 on which the cutting fluid or the like has been deposited.

A process of loading the workpiece 1 into the cutting apparatus 2 and unloading the workpiece 1 from the cutting apparatus 2 and a process of cutting the workpiece 1 will be described below with reference to the drawings. First, as illustrated in FIG. 1, the operator of the cutting apparatus 2 places the workpiece 1 in the placing area 40. Then, the delivery pad 44 delivers the workpiece 1 placed in the placing area 40 from the placing area 40 onto the holding surface 6a of the chuck table 6. For the delivery pad 44 to deliver the workpiece 1, the delivery pad 44 is mounted on the Z-axis movable plate 34 of the moving unit. Since the delivery pad 44 is placed in the standby area 58 before being mounted on the Z-axis movable plate 34, the moving unit is operated to position the engaging portion 48 as the lower distal-end portion of the arm 42 directly below the engageable portion 46 of the delivery pad 44. Then, the Z-axis movable plate 34 is moved in one of the Z-axis directions, i.e., in the upward direction, to bring the engaging portion 48 into contact with the engageable portion 46.

Figure 2A:
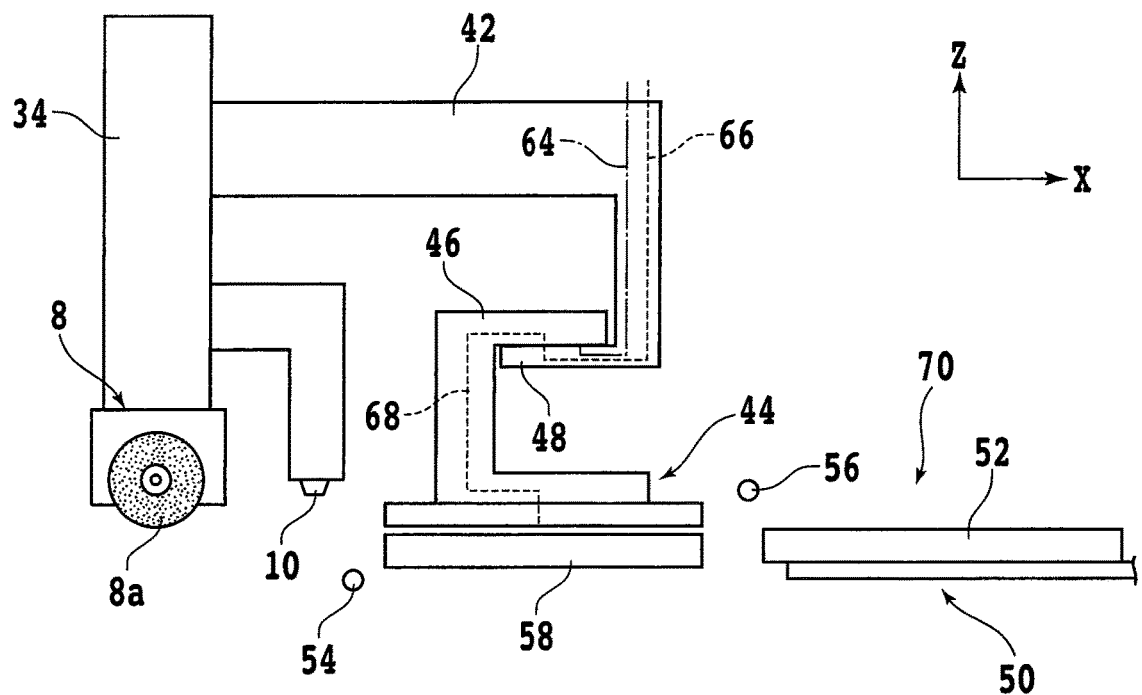
FIG. 2A is a side elevational view schematically illustrating the manner in which a delivery pad is mounted on a moving unit.
Figure 4A:
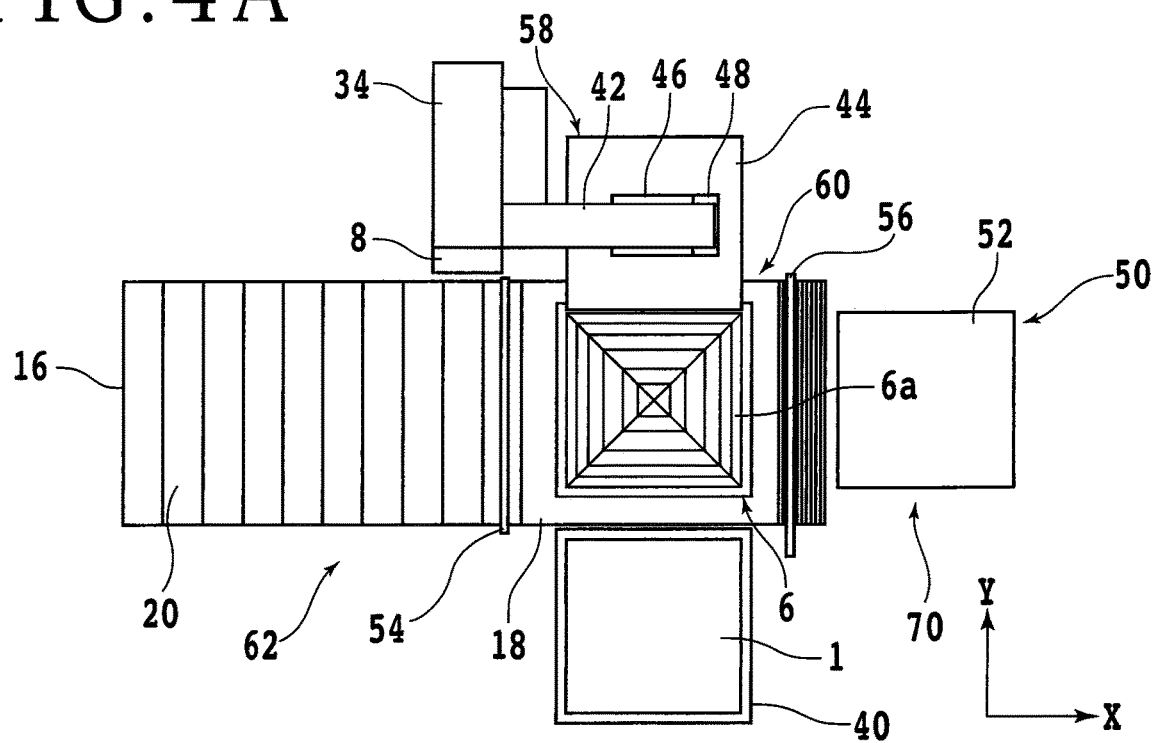
FIG. 4A is a plan view schematically illustrating the manner in which the delivery pad is mounted on the moving unit.

FIG. 2A is a side elevational view schematically illustrating the manner in which the delivery pad 44 is mounted on the moving unit. FIG. 4A is a plan view schematically illustrating the manner in which the delivery pad 44 is mounted on the moving unit. FIGS. 2A and 4A schematically illustrate the manner in which the engaging portion 48 and the engageable portion 46 are brought into contact with each other. When the engaging portion 48 and the engageable portion 46 has contacted each other and the negative pressure acts through the suction channel 64 on the engageable portion 46, the delivery pad 44 is mounted on the moving unit.

Figure 4B:
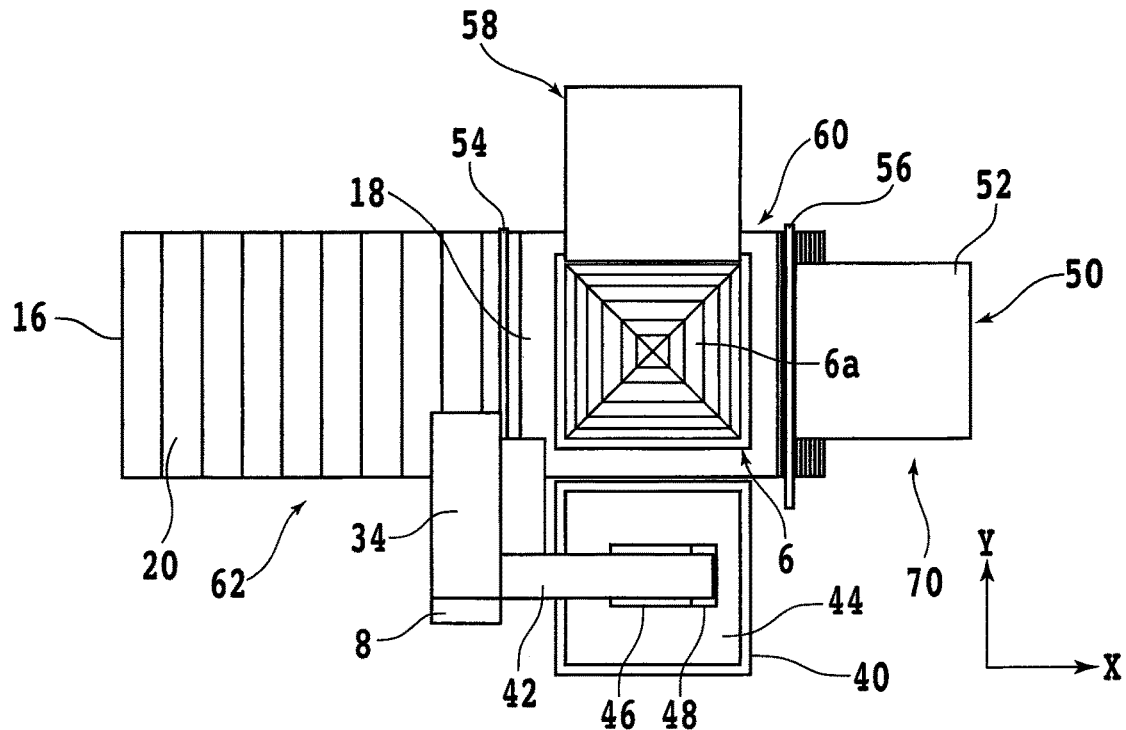
FIG. 4B is a plan view schematically illustrating the manner in which the delivery pad holds the workpiece placed in a placing area under suction.

Then, the moving unit operates to move in one of the indexing-feed directions, i.e., the Y-axis directions, to move the delivery pad 44 to the placing area 40. Then, the Z-axis movable plate 34 lowers the delivery pad 44 until the lower suction surface thereof contacts the workpiece 1 in the placing area 40. Thereafter, the negative pressure acts through the suction channels 66 and 68 on the workpiece 1, holding the workpiece 1 under suction on the delivery pad 44. FIG. 4B is a plan view schematically illustrating the manner in which the delivery pad 44 holds the workpiece 1 placed in the placing area 40 under suction.

Figure 2B:
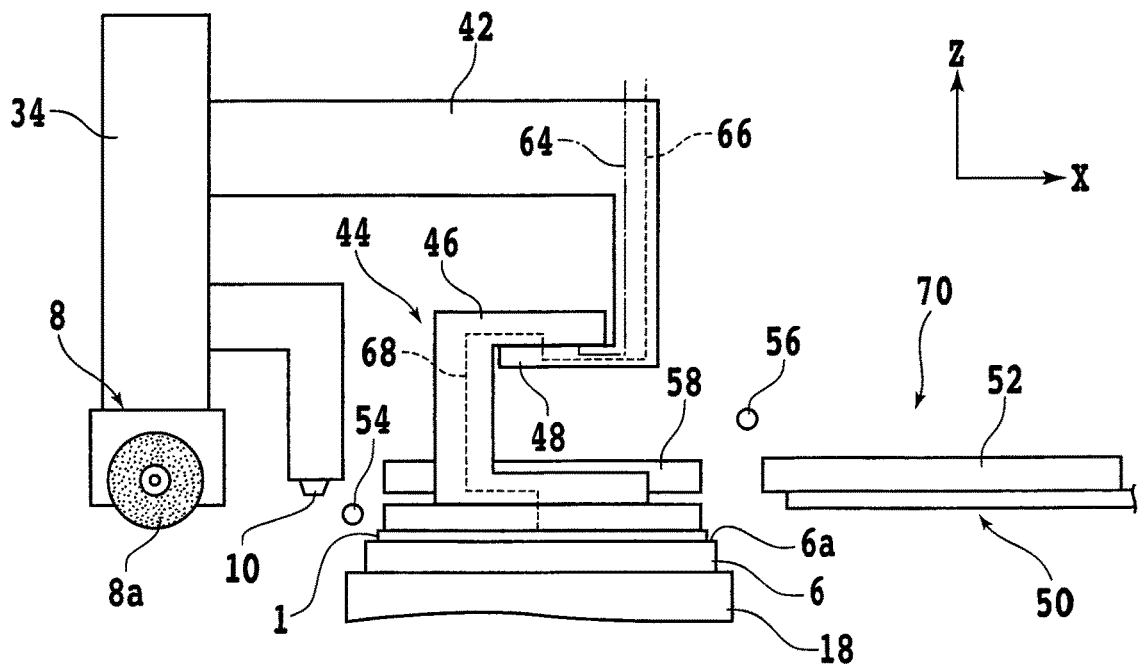
FIG. 2B is a side elevational view schematically illustrating the manner in which the workpiece is loaded onto a chuck table by the delivery pad.
Figure 5A:
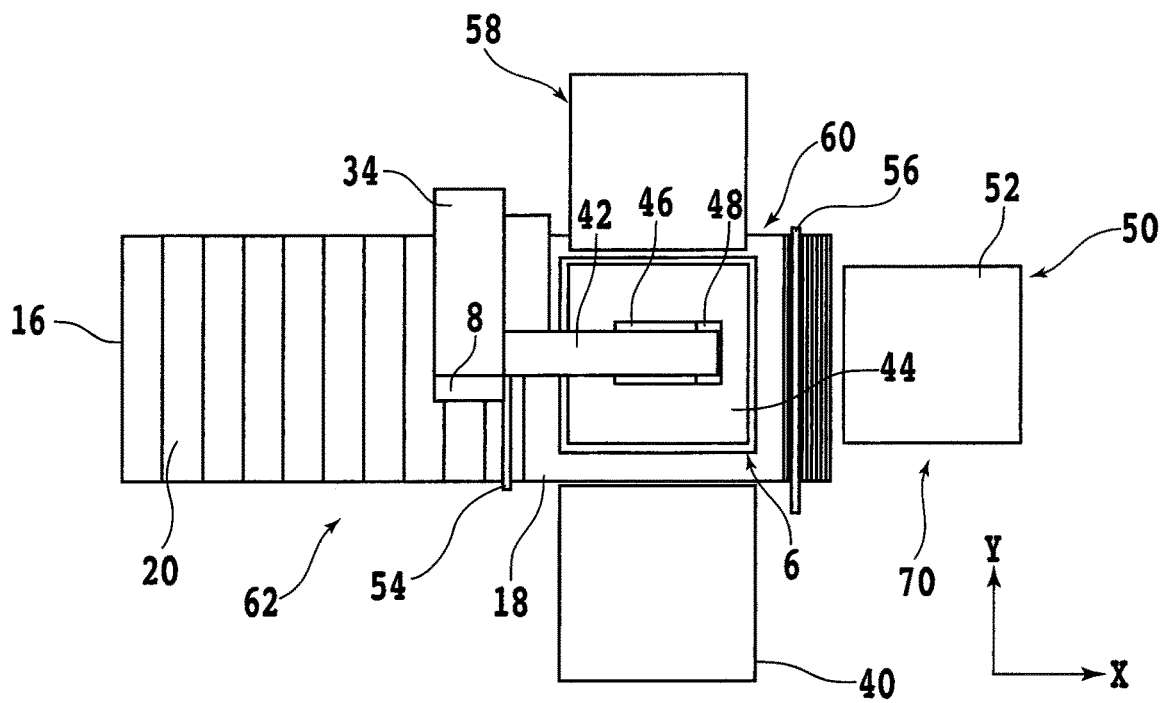
FIG. 5A is a plan view schematically illustrating the manner in which the workpiece is loaded onto the chuck table by the delivery pad.

Thereafter, the delivery pad 44 is lifted and moved in the other indexing-feed direction, i.e., in the other Y-axis direction, to a position above the loading/unloading area 60. The processing-feed unit is actuated to move the chuck table 6 to the loading/unloading area 60, after which the delivery pad 44 is lowered. The delivery pad 44 stops being lowered when the workpiece 1 is brought into contact with the holding surface 6a of the chuck table 6. The delivery pad 44 then stops holding the workpiece 1 under suction, and the chuck table 6 starts to hold the workpiece 1 under suction. The sequence of loading the workpiece 1 onto the chuck table 6 with the delivery pad 44 is now completed. FIG. 2B is a side elevational view schematically illustrating the manner in which the workpiece 1 is loaded onto the chuck table 6 by the delivery pad 44. FIG. 5A is a plan view schematically illustrating the manner in which the workpiece 1 is loaded onto the chuck table 6 by the delivery pad 44. Since the workpiece 1 is thus delivered by the delivery pad 44 that is moved by the moving unit, the cutting apparatus 2 according to the present embodiment does not require an independent moving mechanism for moving the delivery pad 44.

Figure 3A:
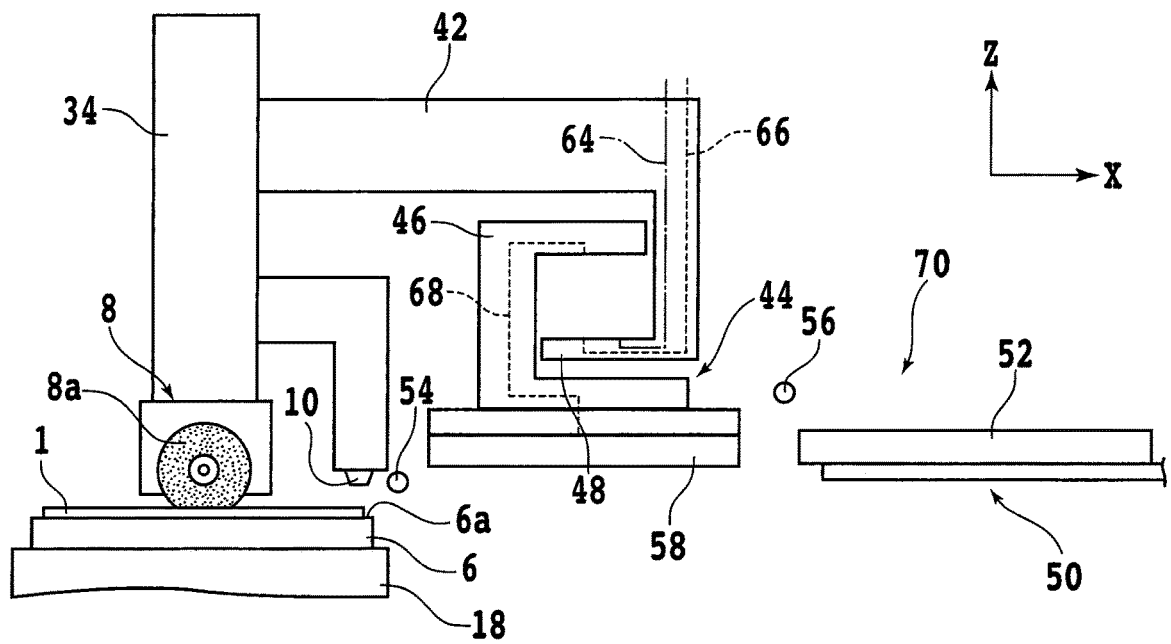
FIG. 3A is a side elevational view schematically illustrating the manner in which the workpiece is cut by a cutting unit.
Figure 5B:
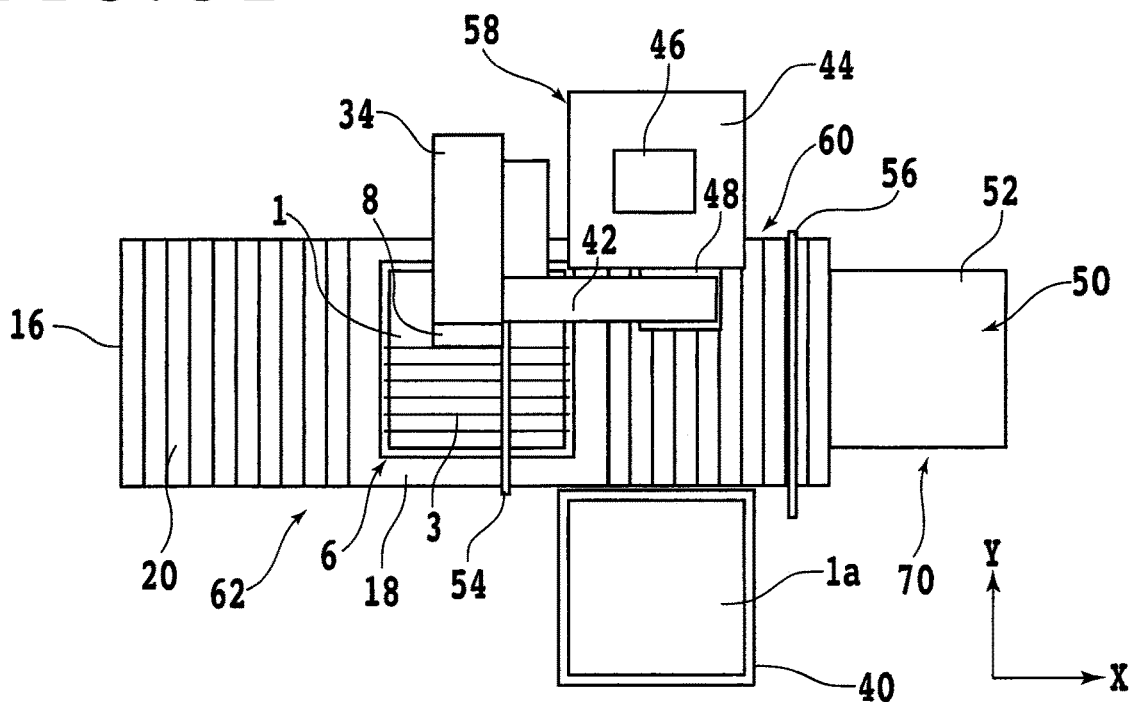
FIG. 5B is a plan view schematically illustrating the manner in which the workpiece is cut by the cutting unit.

FIG. 3A is a side elevational view schematically illustrating the manner in which the workpiece 1 is cut by the cutting unit. FIG. 5B is a plan view schematically illustrating the manner in which the workpiece 1 is cut by the cutting unit. If the delivery pad 44 stays on the moving unit, then it imposes a large load on the moving unit at the time the moving unit moves the cutting unit 8 to cut the workpiece 1. Therefore, before the cutting unit 8 starts to cut the workpiece 1, the delivery pad 44 should preferably be separated from the moving unit and placed on the standby area 58. FIGS. 3A and 5B illustrate the delivery pad 44 placed in the standby area 58. For placing the delivery pad 44 in the standby area 58, the moving unit is operated to bring the delivery pad 44 into contact with the standby area 58, and the suction of the delivery pad 44 through the suction channel 64 is stopped.

For cutting the workpiece 1, the processing-feed unit is actuated to move the X-axis movable table 18 to the processing area 62. Then, the moving unit is actuated to position the cutting blade 8a of the cutting unit 8 at a predetermined height suitable for cutting the workpiece 1. The X-axis movable table 18 is moved in one of the processing-feed directions, i.e., in one of the X-axis directions, to cause the cutting blade 8a to cut the workpiece 1 held on the holding surface 6a of the chuck table 6, forming a cut groove 3 in the workpiece 1. Before the workpiece 1 is thus cut, the camera unit 10 captures an image of the workpiece 1 to confirm a projected dicing line on the workpiece 1 along which to cut the workpiece 1 with the cutting blade 8a, and then the cutting blade 8a and the confirmed line are aligned with each other based on the captured image. After the cutting blade 8a has cut the workpiece 1 along the projected dicing line, the moving unit is actuated to move the cutting unit 8 in one of the indexing-feed directions, i.e., in one of the Y-axis directions. Then, the processing-feed unit is actuated again to cut the workpiece 1 along another projected dicing line. After the workpiece 1 has been cut along a set of all parallel projected dicing lines that extend in one direction, the chuck table 6 is rotated about its own axis perpendicular to the holding surface 6a. Thereafter, the workpiece 1 is cut along another set of all projected dicing lines that extend in another direction perpendicular to the one direction referred to above. During the process of cutting the workpiece 1, the nozzle 8b ejects the cutting fluid that is supplied to the cutting blade 8a and the workpiece 1. The cutting fluid washes away chips produced from the workpiece 1 as it is cut by the cutting blade 8a. Frictional heat generated by the friction between the workpiece 1 and the cutting blade 8a is removed by the cutting fluid.

While the workpiece 1 is being cut, the operator of the cutting apparatus 2 may place a new workpiece 1a in the placing area 40, as illustrated in FIG. 5B. The operator can load workpieces 1a into the cutting apparatus 2 at any desired timings.

After the process of cutting the workpiece 1 has been completed, the processing-feed unit is actuated to move the chuck table 6 to the loading/unloading area 60. At this time, the cleaning nozzle 54 ejects the cleaning liquid to the workpiece 1 to clean the processed surface of the workpiece 1.

Figure 3B:
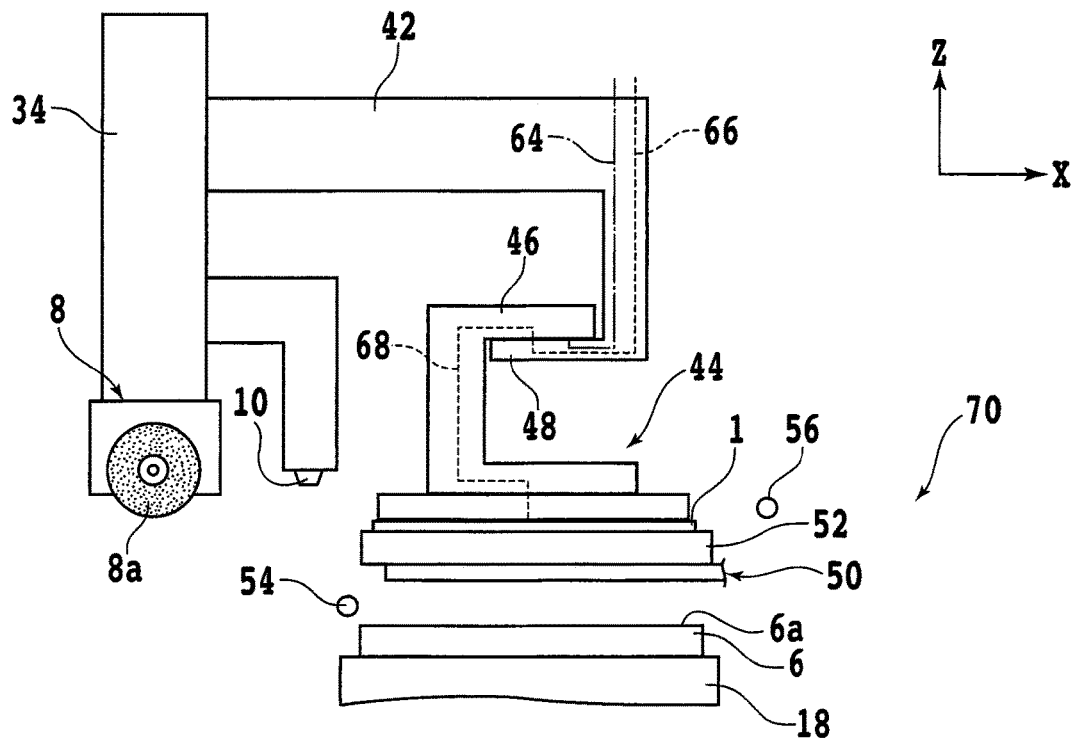
FIG. 3B is a side elevational view schematically illustrating the manner in which the workpiece is placed onto an unloading unit by the delivery pad.
Figure 6A:
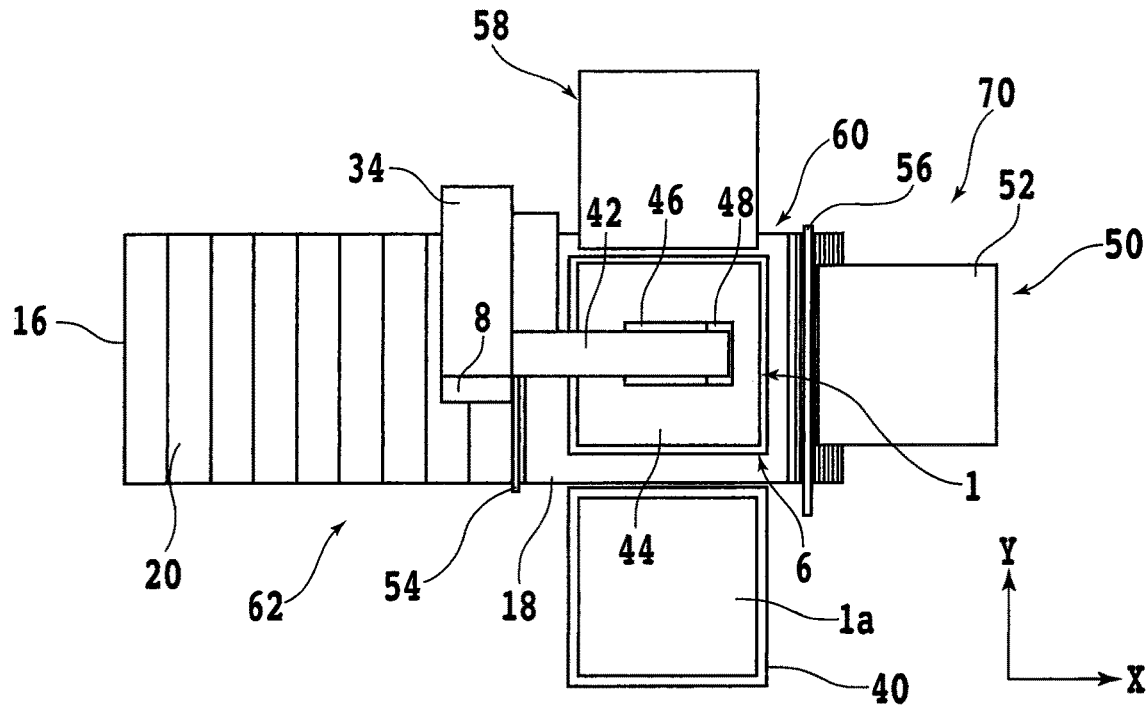
FIG. 6A is a plan view schematically illustrating the manner in which the delivery pad holds the workpiece under suction.
Figure 6B:
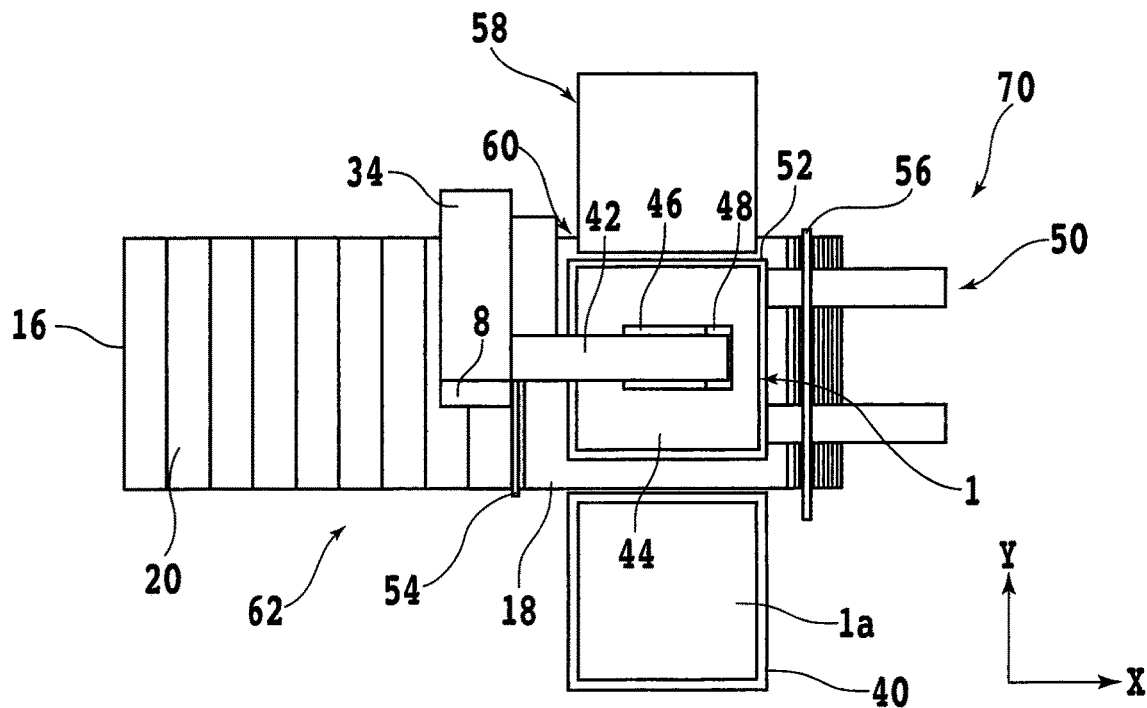
FIG. 6B is a plan view schematically illustrating the manner in which the workpiece is placed on the unloading unit.
Figure 7A:
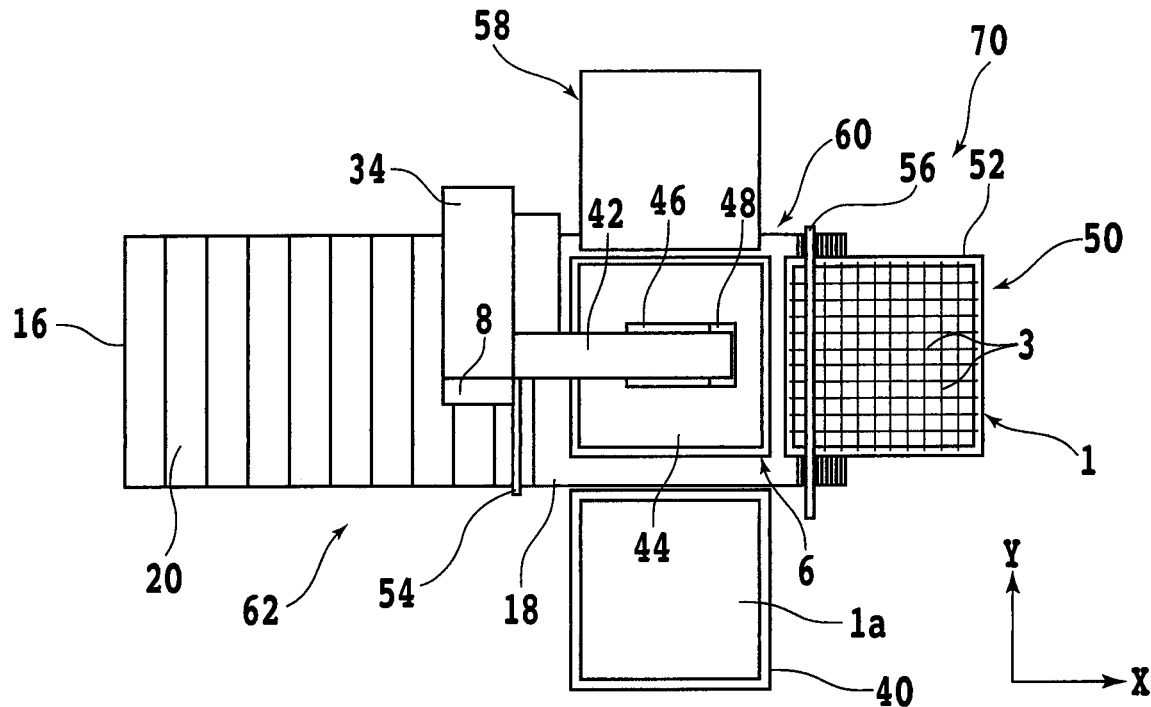
FIG. 7A is a plan view schematically illustrating the manner in which the workpiece is unloaded by the unloading unit.

Then, the workpiece 1 is unloaded from the chuck table 6. For unloading the workpiece 1 from the chuck table 6, the delivery pad 44 is mounted again on the arm 42 of the Z-axis movable plate 34. The moving unit is actuated to move the delivery pad 44, and the delivery pad 44 holds the workpiece 1 under suction. FIG. 6A is a plan view schematically illustrating the manner in which the delivery pad 44 holds the workpiece 1 under suction. Then, the workpiece 1 is moved upwardly in one of the Z-axis directions perpendicular to the holding surface 6a. Thereafter, the unloading table 52 of the unloading unit 50 is moved in one of the processing-feed directions, i.e., in one of the X-axis directions, until the unloading table 52 is positioned below the delivery pad 44 in the area immediately above the loading/unloading area 60. Then, the delivery pad 44 is lowered to bring the workpiece 1 into contact with the unloading table 52, and stops holding the workpiece 1 under suction. The workpiece 1 is now placed on the unloading table 52. FIG. 3B is a side elevational view schematically illustrating the manner in which the workpiece 1 is placed onto the unloading unit 50 by the delivery pad 44. FIG. 6B is a plan view schematically illustrating the manner in which the workpiece 1 is placed on the unloading unit 50. Thereafter, the unloading table 52 of the unloading unit 50 is moved to the unloading area 70, thereby unloading the workpiece 1. FIG. 7A is a plan view schematically illustrating the manner in which the workpiece 1 is unloaded by the unloading unit 50.

The workpiece 1 that has been unloaded from the cutting apparatus 2 has liquids such as the cutting fluid, the cleaning liquid, etc. deposited thereon. These liquids may be scattered around on the floor and in a receptacle for housing the workpiece 1, and may become responsible for contamination. If the liquids remain deposited on the workpiece 1, they may make the workpiece 1 deteriorate. When the unloading table 52 of the unloading unit 50 is moved to the unloading area 70, the drying nozzle 56 may eject the gas under a high pressure to the workpiece 1, thereby drying the workpiece 1 to remove the remaining liquids from the workpiece 1.

Figure 7B:
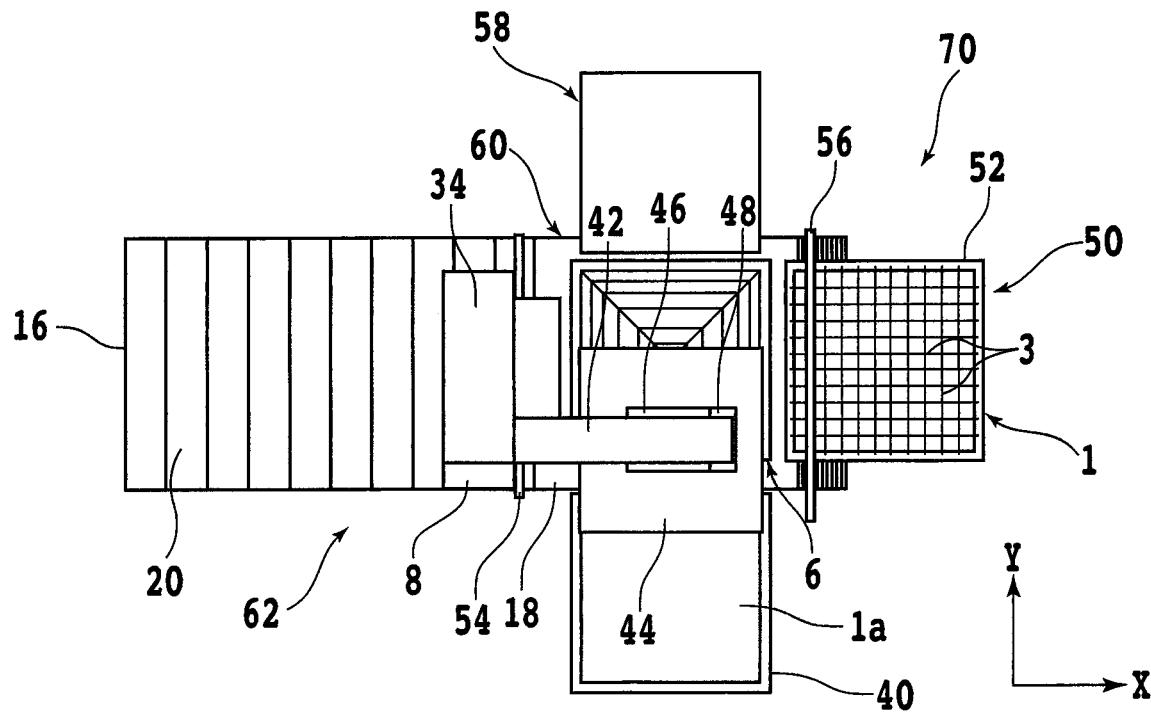
FIG. 7B is a plan view schematically illustrating the manner in which the delivery pad is moved by the moving unit in order to hold a new workpiece under suction.

The operator can remove the processed workpiece 1 from the cutting apparatus 2 at any desired timing. FIG. 7B is a plan view schematically illustrating the manner in which the delivery pad 44 is moved by the moving unit in order to hold a new workpiece 1a under suction. As illustrated in FIG. 7B, in the cutting apparatus 2, the delivery pad 44 can start delivering the new workpiece 1a before the processed workpiece 1 is unloaded from the unloading table 52.

The workpiece 1 may be dried while the new workpiece 1a is being cut by the cutting unit 8. Specifically, while the new workpiece 1a is being cut by the cutting unit 8, the drying nozzle 56 ejects the gas under a high pressure and at the same time the unloading table 52 with the workpiece 1 thereon is repeatedly moved back and forth below the drying nozzle 56 to dry the workpiece with the applied gas.

With the cutting apparatus 2 according to the present embodiment, the delivery pad 44 that is detachably mounted on the moving unit can deliver the workpiece 1. Since the delivery pad 44 can be moved by the moving unit that moves the cutting unit 8 and the camera unit 10, the cutting apparatus 2 can deliver the workpiece 1 without using an independent delivery mechanism. The cutting apparatus 2 is a fully automatic cutting apparatus where the operator the operator can load and unload the workpiece 1 at a desired timing. The cutting apparatus 2 does not require an independent moving mechanism for delivering the workpiece 1, is not complex in structure, and hence is prevented from being unduly large in size and high in cost.

In the above embodiment, the operator places a workpiece 1 to be cut in the placing area 40 and unloads a workpiece 1 that has been cut from the unloading table 52 of the unloading unit 50. However, a cutting apparatus 2 according to an aspect of the present invention is not limited to such an operation sequence, but may operate otherwise. For example, the operator may place a workpiece 1 to be cut on the unloading table 52. The unloading unit 50 and the delivery pad 44 may then deliver the workpiece 1 to the chuck table 6. The workpiece 1 that has been cut may be delivered from the chuck table 6 to the placing area 40 by the delivery pad 44. The operator may then unload the cut workpiece 1 from the placing area 40. In the above embodiment, the delivery pad 44 holds the workpiece 1 under suction. However, the delivery pad 44 may hold the workpiece 1 according to other holding principles. For example, the delivery pad 44 may hold the workpiece 1 under magnetic or electrostatic forces.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A cutting apparatus comprising:
    a cutting unit cutting a workpiece held on a holding surface of a chuck table with a cutting blade mounted on a spindle;
    a processing-feed unit moving the chuck table in a processing-feed direction parallel to the holding surface, between a processing area for cutting the workpiece and a loading/unloading area for loading and unloading the workpiece;
    a moving unit moving the cutting unit in an indexing-feed direction parallel to the holding surface and perpendicular to the processing-feed direction and in a direction perpendicular to the holding surface;
    a placing area disposed adjacent to the loading/unloading area, said placing area configured to receive the workpiece to be cut therein;
    an unloading unit configured for receiving the workpiece that has been cut; and
    a delivery pad non-fixedly attached to the moving unit and configured for delivering the workpiece to be cut from the placing area to the chuck table positioned in the loading/unloading area and delivering the workpiece that has been cut on the chuck table to the unloading unit;

wherein the delivery pad is detached from the moving unit in a standby area disposed adjacent to the loading/unloading area when not in use, and when in use, the delivery pad is mounted on the moving unit in the standby area, holds the workpiece under suction while mounted on the moving unit, and transports the workpiece by being moved by the moving unit while holding the workpiece under suction.

2. The cutting apparatus according to claim 1, wherein the delivery pad includes an engageable portion as an upper portion thereof;

the moving unit has a movable plate to which the cutting unit is fixed and an arm extending from the movable plate in the processing-feed direction and having an engaging portion for engaging the engageable portion; and the movable plate is moved in a direction perpendicular to the holding surface to cause the engaging portion of the arm to engage the engageable portion of the delivery pad placed in the standby area, thereby coupling the delivery pad to the movable plate.

3. The cutting apparatus according to claim 1, wherein the unloading unit includes an unloading table for receiving the workpiece that has been cut thereon, the unloading table being movable between an area immediately above the loading/unloading area and a cut workpiece unloading area disposed laterally of the processing-feed unit; and the unloading unit moves the unloading table with the workpiece that has been cut thereon from the area immediately above the loading/unloading area to the cut workpiece unloading area, wherein the workpiece that has been cut is removed from the unloading table in the cut workpiece unloading area for further processing.

4. The cutting apparatus according to claim 3, further comprising:

a drying nozzle disposed over a path along which the unloading table is movable, and ejecting a gas to the workpiece placed on the unloading table to remove a liquid deposited on the workpiece while the workpiece is cut by the cutting blade, from the workpiece.

5. The cutting apparatus according to claim 1, further comprising:

a cleaning nozzle disposed over a path along which the chuck table is movable by the processing-feed unit, and ejecting a liquid to the holding surface of the chuck table or the workpiece held on the chuck table to clean the holding surface of the workpiece.

6. The cutting apparatus according to claim 1, wherein the delivery pad includes a suction channel coupled to a suction channel of the moving unit.

7. The cutting apparatus according to claim 1, wherein the moving unit includes an arm with an engaging portion and the delivery pad has an engageable portion, wherein the engaging portion of the arm of the moving unit is positioned below and engages the engageable portion of the delivery pad to lift and move the delivery pad.

8. The cutting apparatus according to claim 7, wherein the delivery pad includes a suction channel coupled to a suction channel of the moving unit.

* * * * *